United States Patent
Taniguchi et al.

[11] Patent Number: 5,137,349
[45] Date of Patent: Aug. 11, 1992

[54] PROJECTION-TYPE OPTICAL APPARATUS

[75] Inventors: Tetsuo Taniguchi; Kazuaki Suzuki; Toshihiko Tsuji, all of Kawasaki; Masato Hatasawa, Yokohama, all of Japan

[73] Assignee: Nikon Corporation, Tokyo, Japan

[21] Appl. No.: 633,314

[22] Filed: Dec. 24, 1990

[30] Foreign Application Priority Data

Dec. 27, 1989 [JP] Japan .................... 1-339084

[51] Int. Cl.$^5$ .............................................. G03B 27/34
[52] U.S. Cl. ..................................... 353/122; 353/101; 355/30; 355/53; 355/55
[58] Field of Search ............... 353/100, 122, 101, 121; 355/53, 55, 63, 52, 44, 30, 67; 350/253

[56] References Cited
U.S. PATENT DOCUMENTS

| | | | |
|---|---|---|---|
| 4,601,560 | 7/1986 | Isohata et al. | 353/101 |
| 4,650,983 | 3/1987 | Suwa | 250/204 |
| 4,666,273 | 5/1987 | Shimizu et al. | 353/101 |
| 4,668,077 | 5/1987 | Tanaka | 355/30 |
| 4,704,020 | 11/1987 | Murakami et al. | 353/122 |
| 4,708,465 | 11/1987 | Isohata et al. | 355/73 |
| 4,714,331 | 12/1987 | Oda et al. | 353/101 |
| 4,801,977 | 1/1989 | Ishizaka et al. | 355/30 |
| 4,952,970 | 8/1990 | Suzuki et al. | 355/55 |

Primary Examiner—William A. Cuchlinski, Jr.
Assistant Examiner—William C. Dowling
Attorney, Agent, or Firm—Shapiro and Shapiro

[57] ABSTRACT

In a projection-type optical apparatus in which a projection optical system projects an image of an object upon a substrate, a position detecting sensor mechanically connected to the projection optical system detects the position of the projection optical system relative to the substrate along the optical axis of the projection optical system. A displacement measuring device measures relative displacement between the position detecting sensor and the projection optical system along the optical axis. The substrate is brought into coincidence with an optimum image forming plane of the projection optical system on the basis of the position detected by the position detecting sensor and the displacement measured by the displacement measuring device.

4 Claims, 3 Drawing Sheets

FIG. I

PROJECTION-TYPE OPTICAL APPARATUS

BACKGROUND OF THE INVENTION

1. Field of the Invention

This invention relates to a projection-type optical apparatus used in the manufacture of semiconductor devices and, in particular, to a focal position correcting mechanism.

2. Related Background Art

Recently, a reduction-type projection printer based on the step and repeat system, called a "stepper", is generally being used in the lithography process in the production of semiconductor devices. It is an apparatus capable of projecting a minute pattern formed on a reticle (or mask) on a wafer and exposing it thereon with high resolution. As semiconductor devices become more integrated and more minute, the resolution limit of a stepper of this type is becoming higher from year to year. In a projection optical system having a large numeral aperture, the depth of focus is inevitably small. Further, any change in the environmental conditions around the projection optical system (the atmospheric pressure, temperature, humidity, etc.), the exposure condition (the condition of the illuminating light incident on the projection optical system), etc. causes the image formation characteristics (the focal position and the projecting magnification) of the projection optical system to vary. In particular, the variation in the focal position caused by a rise in temperature in the projection system due to its absorption of illuminating light, or to the temperature change in the projection optical system due to changes in the environmental temperature, occurs to a degree not to be neglected. At present, the deterioration in the image forming characteristics due to this variation in the focal position is a problem that should be solved.

In view of this, a system has been proposed in which the entire stepper is lodged in a clean chamber that is temperature controlled (e.g., within the range of 23±0.1° C.) and that maintains a certain degree of cleanliness. In this system, the projection optical system, which has an important influence on the image formation characteristics, is exclusively installed in a temperature control device which is separate from the chamber lodging the entire apparatus, with the temperature of the projection optical system being controlled by using a fluid which is under a more sophisticated temperature control, thereby efficiently avoiding deterioration in the image formation characteristics. Apart from this, a method of correcting the wafer position has been proposed in which the peripheral temperature around the projection optical system or the temperature of the projection optical system itself is measured so as to predict the variation in the image formation characteristics corresponding to the temperature change, thereby correcting the wafer position.

As stated above, in the above-mentioned conventional systems, the stepper is used in a chamber which is temperature controlled with an accuracy level of ±0.1° C. However, in the case of a projection optical system having a large numerical aperture, even this level of accuracy in temperature control cannot be said to be enough to avoid deterioration in the image formation characteristics. Further, it should also be noted that a wafer stage, which is adapted to move with a wafer mounted thereon, is provided below the projection optical system. The displacement of this stage may cause a change in the conditions for the airconditioning of the projection optical system, thereby causing a temperature change in the projection optical system. In particular, the hardware for holding the lens elements, i.e., the so-called lens-barrel, is subject to expansion or contraction due to temperature changes. This constitutes one of the factors causing a variation in the focal position. It will be understood from the above that some other control technique as mentioned above is needed in addition to the temperature control by the chamber.

Of the above-mentioned prior-art techniques, however, the method in which the variation in the focal position is predicted from the temperature of the projection optical system, or the peripheral temperature, has the following problems: first, the variation in the focal position of the projection optical system is caused by a number of factors, including the temperature changes in the lens elements of the projection optical system, the temperature changes in the hardware or lens-barrel supporting the projection optical system, etc., which means it is not enough to measure the temperature of any one particular point to check the temperature of the entire system. Second, it should be noted that, when directly measuring the temperature of the projection optical system, the temperature rise in the projection optical system due to the absorption of the illuminating light by the system and the temperature change in the projection optical system due to changes in the environmental temperature are measured in a duplicated manner. Regarding the absorption of the illuminating light, the respective different absorption characteristics of the lens elements cause a temperature difference between the lens elements. As to the changes in the environmental temperature, the respective different heat capacities of the lens elements cause a temperature difference between the elements. Thus, these two categories of temperature change affect the temperature distribution in the projection optical system, i.e., the image formation characteristic thereof, in different ways, so that it is impossible to separate these two types of temperature changes from each other by a simple temperature measurement. It will accordingly be understood that the above-mentioned method is not practical for a projection optical system in which a strict focal position correction is required. In such a system, the most practical way is to adopt a system in which only the projection optical system is further temperature controlled so as to diminish the temperature change in the projection optical system.

Usually, in a stepper, the relative positional adjustment (focusing) between the plane in which the image of a reticle pattern can be formed with an optimum contrast (the optimum image forming plane) and the wafer surface is performed by adopting a correction method in which a grazing-incidence-type focus detection system (AF sensor), as disclosed in U.S. Pat. No. 4,650,983, is firmly attached to the periphery of the lens-barrel of the projection optical system in a mechanical manner so as to measure the deviation (the defocusing amount) of the wafer surface with respect to the optimum image forming plane. A focal position correcting mechanism, which drives the wafer in the direction of the optical axis of the projection optical system (the Z-axis direction), is offset in such a manner that the above defocusing amount measured attains a certain value (e.g., in the range of ±0.3 μm), thereby correcting the wafer surface position with respect to the optimum image forming plane. Accordingly, even when the expansion/contraction of the lens barrel is avoided by the temperature control, the displacement in the Z-axis direction of the AF sensor due to temperature change, in other words, the relative displacement in the Z-axis direction between the hardware of the AF sensor and the projection optical system (the lens barrel), is allowed to arise as a focal position deviation, i.e., a defocusing amount. To avoid this, temperature stabilization has to be effected not only for the projection optical system but also for the AF sensor, with the result that the temperature control apparatus has to be a large-scaled one. Further, even when the projection optical system and the AF sensor are temperature stabilized, the accuracy in temperature control is at best in the range of ±0.05° C., which cannot be called enough to avoid deterioration in the image formation characteristics. Furthermore, the difference in heat capacity between the projection optical system (in particular, the lens-barrel thereof) and the AF sensor (in particular, the supporting hardware thereof) leads to a difference in thermal absorption characteristic between them, so that the direction of expansion/contraction in one is reverse to that in the other, resulting in a still larger defocusing amount.

SUMMARY OF THE INVENTION

In order to solve the above problems, this invention adopts a construction in which is provided a displacement measuring means for measuring the relative displacement between the projection optical system and the position detecting means for detecting the deviation of the photosensitive substrate with respect to the optimum image forming plane. In performing focusing, the optimum image forming plane and the photosensitive substrate are brought into coincidence with each other with an offset corresponding to the above relative displacement measured, thereby cancelling the relative displacement between the AF sensor and the projection optical system due to temperature changes, i.e., reducing the variation in the focal position (the deviation of the photosensitive substrate with respect to the optimum image forming plane) to approximately zero.

In accordance with this invention, the relative displacement between the position detecting means for the photosensitive substrate and the projection optical system is measured and the position detecting means is offset in correspondence with this relative displacement, thereby bringing the photosensitive substrate correctly into coincidence with the optimum image forming plane of the projection optical system. Thus, the focal position displacement due to the relative displacement between the projection optical system and the position detecting means can be reduced to approximately zero without providing a large-scaled apparatus for integral temperature control of the projection optical system and the position detecting means, thereby making it possible to bring the optimum image forming plane and the photosensitive substrate into coincidence with each other with high accuracy.

The present invention will now be described in detail with reference to an embodiment thereof.

DETAILED DESCRIPTION OF THE PREFERRED EMBODIMENT

Figure 3:
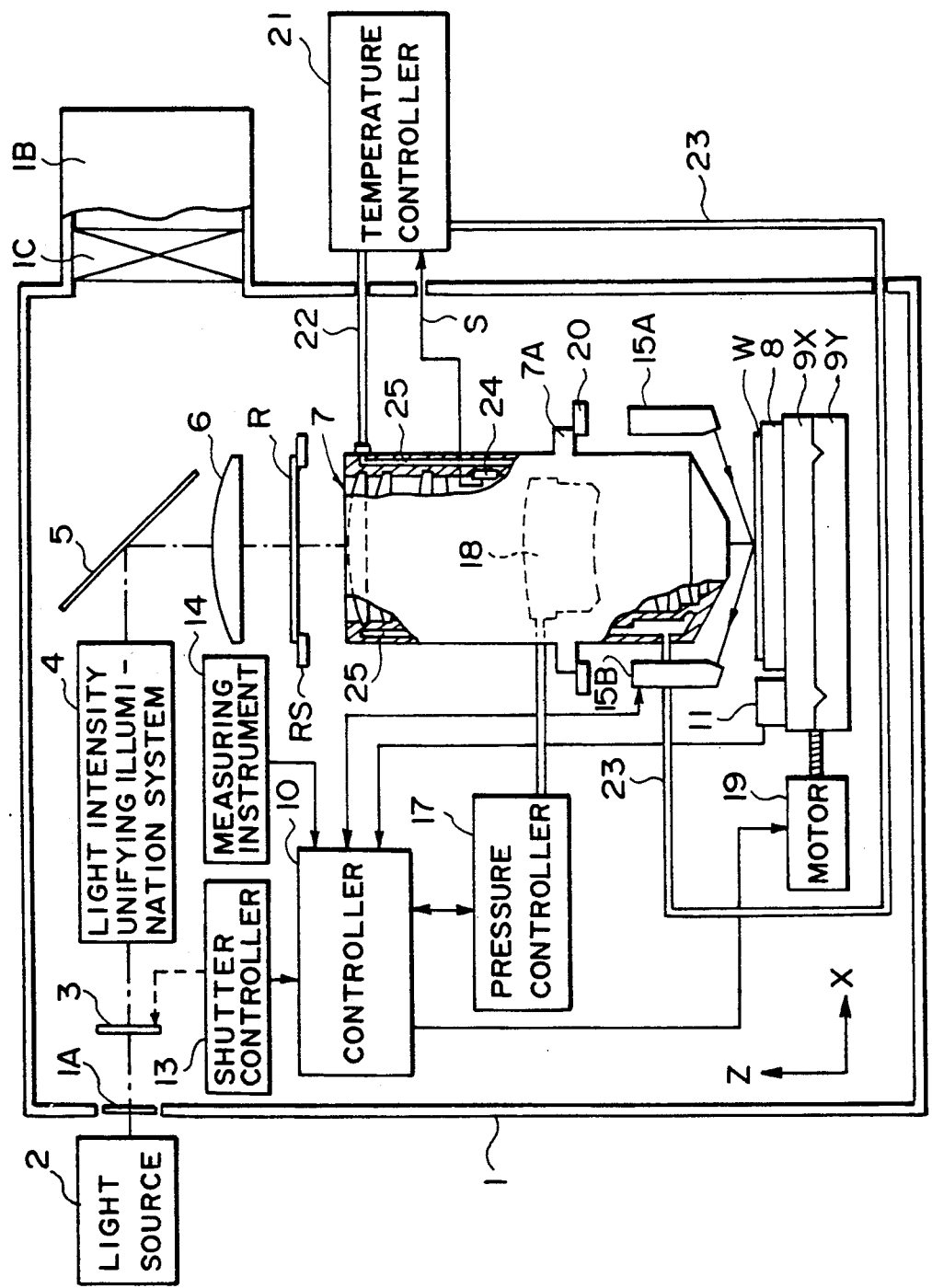
FIG. 3 is an overall schematic view showing the construction of a projection-type optical apparatus to which this invention is applied.

FIG. 3 shows the overall construction of the apparatus of this invention as applied to a stepper for manufacturing semiconductor devices. The construction of this embodiment will be described with reference to FIG. 3.

Referring to FIG. 3, the main components of the stepper are arranged in a clean chamber 1, whose inner air temperature and humidity are kept substantially constant. Normally, the air temperature and the humidity in the chamber 1 are controlled by means of a chamber airconditioner 1B and a HEPA filter 1C, with the control accuracies according to preset values being approximately ±0.1° C. and ±15%, respectively. An illuminating-light source 2 (an extra-high pressure mercury lamp, an excimer laser device or the like), which constitutes a heat source, is arranged outside the clean chamber 1. Rays of light, such as g-rays, i-rays, or a KrF eximer laser beam, whose wavelength is such that the resist layer is exposed to light (exposure wavelength), enter the chamber 1 through a window 1A (consisting of an optical member, etc.) which is separated for the chamber 1, and travel through a shutter 3 to reach a light intensity uniformalizing illumination system 4 for making the intensity of the light uniform over the entire surface of the exposure area. The rays are then bent downwards by a mirror 5 and, after passing through a main condenser lens 6, illuminate a reticle R disposed on a reticle stage section RS with a uniform illuminance. The reticle R is a mask on which a circuit pattern or the like is drawn. After passing through the reticle R, the illuminating light passes through a one-side or both-side telecentric projection optical system 7 and forms on the surface of a wafer W an image of the pattern on the reticle R, transferring the image thus formed onto the wafer. The wafer W is disposed on a wafer stage section (8, 9X, 9Y) through the intermediation of a wafer holder (θ table), which is not shown, and is exposed to light by the step and repeat method as it moves along. The entire stepper is built on a vibration-proof stand (not shown), the wafer stage section being provided on a base plate provided on the vibration-proof stand. The wafer stage section is composed of three stages. Starting from the lowest one, they are: a Y-stage 9Y adapted to make a one-dimensional movement in the Y-axis direction, an X-stage 9X adapted to make a one-dimensional movement in the X-axis direction, and a Z-stage 8 adapted to make a jogging movement in the Z-axis direction with the wafer W mounted thereon This wafer stage section makes a two-dimensional movement in the X- and Y-axis directions by the step and repeat method by means of a motor 19, and a jogging movement in the Z-axis direction (The motor for the Z-stage 8 is provided on the X-stage 9X). Further, retained on the base plate provided on the vibration-proof stand are an AF sensor (to be described below), etc., and firmly attached to a chamber section above this base plate is a column 20, which serves to fix a flange 7A provided on the outer periphery of the lens barrel of the projection optical system 7. Further, firmly attached to a chamber section above the column 20 is a column (not shown)

which surrounds the projection optical system 7 and whose upper section retains the reticle stage section RS. It is desirable that this column be made of a heat resistance alloy, such as Invar, so that the distance in the Z-axis direction between the projection optical system 7 and the vacuum attracting surface of the reticle R on the reticle stage RS may be kept substantially constant.

As illustrated, the stepper further includes a temperature controller 21, which constitutes the temperature controlling system for the projection optical system 7. This temperature controller 21 is composed of a heater, a cooler, a pump, a compressor, etc., and is adapted to keep the temperature of a fluid (which may be a gas or a liquid, or freon gas, which allows the utilization of the merits of both) at a predetermined level. The temperature controller 21 supplies through a pipe 22 a temperature controlled fluid into a sealed space 25 which cylindrically surrounds substantially the entire periphery of the lens barrel of the projection optical system 7. The temperature controlled fluid flows through the space 25 along the lens barrel of the projection optical system 7, and returns to the temperature controller 21 through a pipe 23. The temperature controller 21 receives a temperature signal S from a temperature sensor 24, which is provided at a position that allows direct measurement of the temperature of the lens barrel (e.g., at a position inside the lens barrel), and controls the temperature of the fluid in such a manner that the temperature signal S is kept at substantially the same level. The pipes 22 and 23 are insulated from temperature changes on the outside by a heat insulating material or the like, and are partly made of a flexible material so as to prevent the vibration of the temperature controller 21 from being transmitted to the projection optical system 7.

Provided in the projection optical system 7, shown in FIG. 3, is a pressure controller 17, which serves to automatically compensate for any variation in the image formation characteristics (the projecting magnification and the focal position) attributable to changes in environmental conditions, exposure conditions, etc. and which is composed of a bellows pump, a valve, etc. The pressure controller 17 utilizes the physical phenomenon in which the refractive index of a gas changes depending upon the pressure, and is adapted to keep the air pressure in a single or a plurality of air sealed chambers 18 at a predetermined value indicated by a controller 10, thereby forcibly controlling the image formation characteristics of the projection optical system 7 each time it is needed. In this embodiment, this pressure controller 17 serves as a mechanism for correcting the projecting magnification.

The focal position correction is effected by measuring the distance between the projection optical system 7 (the optimum image forming plane) and the wafer W by means of an AF sensor, and offsetting the focal position correcting mechanism, which drives the Z-stage 8, in such a manner that the measured distance value is kept constant.

The focal position correcting mechanism of this invention will be described with reference to FIG. 1, which shows a part of FIG. 3 in an enlarged state. The AF sensor, which constitutes the position detecting means of this invention, employs an LED or a halogen lamp as its light source, and is composed of a light emitting element 15A, which causes rays of light to be projected upon the wafer W obliquely from above through a condenser lens, etc. (at an angle of incidence of 45° to 80°), and a light receiving element 15B, which receives the reflected light from the wafer W. The light emitting element 15A and the light receiving element 15B are fitted into the lens-barrel supporting hardware 20A (the column 20) through the intermediation of a fitting member 16. Accordingly, the AF sensor can detect any displacement in the direction of the optical axis AX of the wafer W from a predetermined position (e.g., the optimum image forming plane) on the basis of the shift of the reflected light from the wafer W. A displacement signal PSS emitted from the AF sensor is supplied to the controller 10, which supplies the signal to the motor 19 for driving the Z-stage 8. The motor 19 is then driven to move the Z-stage 8 until the wafer reaches a predetermined position (i.e., until the displacement amount becomes zero), thereby keeping the distance between the projection optical system 7 and the wafer W constant. The calibration of the AF sensor (the adjustment for setting the optimum image forming plane as the zero-point reference) is effected by optically offsetting it by providing a plane parallel glass plate, etc. in the optical path of the light receiving element 15B, or by electrically offsetting the detection signal. In this embodiment, the AF sensor is offset by inclining a plane parallel glass plate HV provided in the optical path of the light receiving element 15B. The position detecting means is not restricted to an optical-type AF sensor. This invention also permits the employment, for example, of a so-called air micrometer, which measures the displacement amount from the pressure of the air it blows off.

Figure 1:
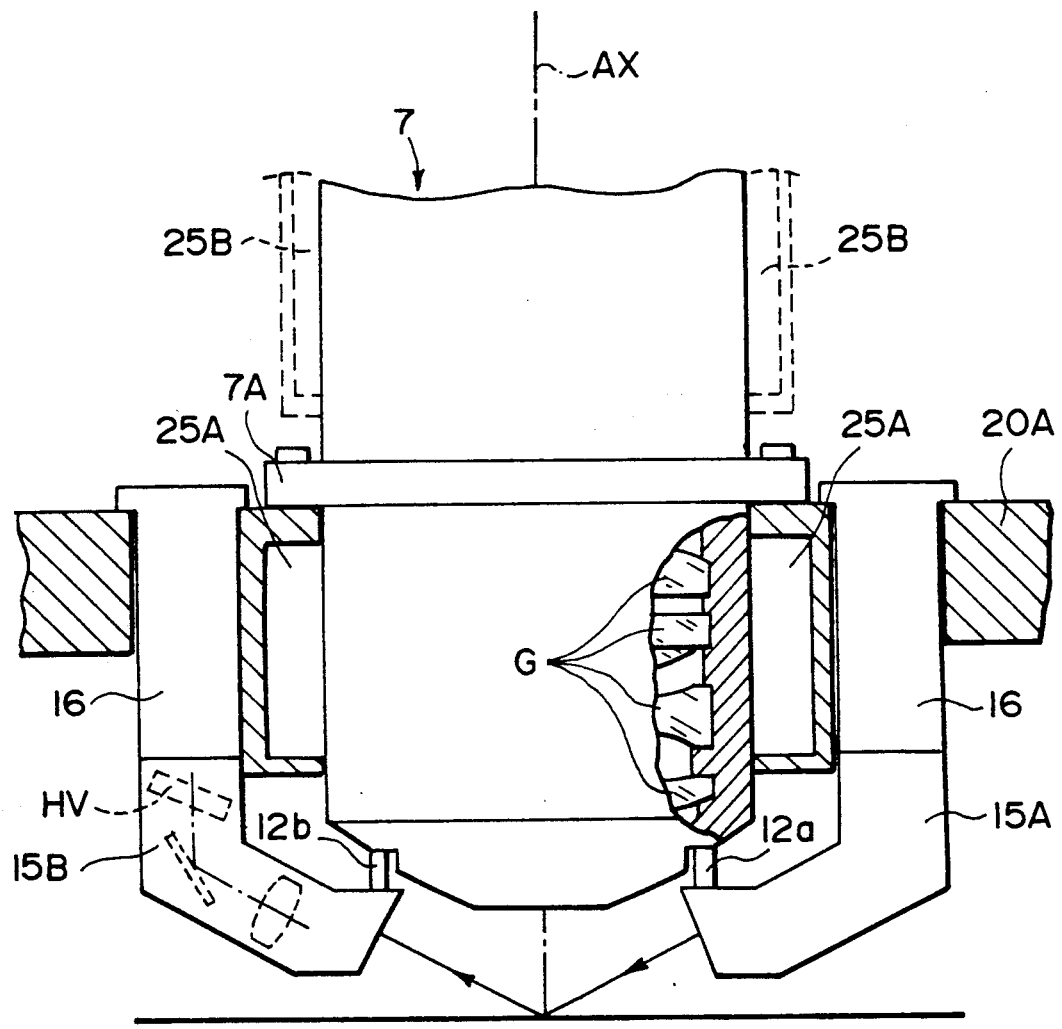
FIG. 1 is a schematic view of a projection-type optical apparatus to which this invention is applied.

FIG. 1 further shows displacement meters 12a and 12b, which serve as the displacement measuring means, an important component of the apparatus of this invention. The displacement meters 12a and 12b serve to measure any relative displacement in the Z-axis direction between the projection optical system 7 and the AF sensor (specifically, it is a mechanical relative displacement in the Z-axis direction between the lowest lens element of the projection optical system 7 and the entrance/exit for light in the AF sensor), and to supply a signal DSS representing this relative displacement to the controller 10. It is difficult to directly measure the distance between the lowest lens element of the projection optical system 7 and the entrance/exit for light in the AF sensor, so that, in this embodiment, variation in the distance between the lower end of the projection optical system 7 (the lens barrel) and the upper end of the AF sensor (the supporting hardware) is measured as an approximate alternative for the above displacement (ΔL described below). The displacement meters 12a and 12b may consist, for example, of differential transformers, strain gages, or capacity type displacement sensors. While in this embodiment two displacement meters 12a and 12b are arranged between the light emitting element 15A and the projection optical system 7, and between the light receiving element 15B and the projection optical system 7, respectively, there is no limitation to the positions and the number of displacement meters. It is desirable, however, that the displacement meters 12a and 12b be provided in the lowest possible section of the lens barrel of the projection optical system 7. Further, while at least one displacement meter is needed, it is desirable that a plurality of displacement meters be provided so as to take an average of their detection values since the thermal expansion of the lens barrel of the projection optical system 7 and the fittings 16, etc. of the AF sensor may not be isotropic.

An change in the environmental conditions (atmospheric pressure, temperature, humidity, etc.) in the chamber 1 is measured by a measuring instrument 14 and is transmitted to the controller 10. The relationship between the environmental conditions and the projecting magnification and focal position is obtained through experiment in a condition where the temperature of the lens barrel of the projection optical system 7 and the peripheral temperature around it are kept constant by previously operating the temperature controller 21. The relationship thus obtained is stored in the controller 10 in the form of a numerical expression, a table, etc. An illumination sensor 11, provided on the wafer stage section, serves to measure the energy of the illuminating light incident upon the projection optical system 7, and transmits a signal IMS indicative of the energy amount to the controller 10. A shutter control circuit 13 serves to control the opening and closing of a shutter 3 and to supply a shutter opening/closing signal SSS to the controller 10. The controller 10 obtains variations in the projecting magnification, the focal position, etc. on the basis of the output signals from the above-mentioned measuring instruments. Afterwards, it calculates a pressure in the air chambers and a drive amount of the Z-stage 8 which will cancel such variations, and supplies predetermined instructions to the pressure controller 17, the motor 19, etc.

Next, the principle of the present invention will be briefly described. Two types of factors are responsible for the variation in the focal position of the projection optical system 7 in response to any change in the environmental temperature: one type of factors are attributable to changes in the lens elements D of the projection optical system, including changes in their refractive index, changes in their surface configuration, and changes in the distance between the lens elements. The other type of factors are attributable to the air existing between the lens elements, including changes in its refractive index. The sum total of the focal position variations due to these factors will be expressed as: $\Delta f_{LENS}$ ($\mu m/°C.$).

Further, since the projection optical system 7 is disposed on the column 20 of the apparatus body through the intermediation of the flange 7A, a change (expansion or contraction) $\Delta l_{LENS}$ ($\mu m/°C.$) in the distance $l_{LENS}$ between the flange 7A (the lower surface thereof) and the tip of the projection optical system 7 (the length of the lens barrel), which is caused, for example, by a change in the environmental temperature, results in the optimum image forming plane being displaced $\Delta l_{LENS}$ on the apparatus. Since the AF sensor is attached to the lens-barrel supporting hardware 20A (the column 20) through the intermediation of the fittings 16, a change, for example, of $\Delta l_{AF}$ ($\mu m/°C.$) in the distance $l_{AF}$ between the column 20 (the upper surface thereof) and the entrance/exit for light of the AF sensor 15 results in the zero-point reference of the AF sensor being displaced $\Delta l_{AF}$ on the apparatus with respect to the optimum image forming plane. From the above, the variation $\Delta F(T)$ in the focal position (the defocusing amount) at a peripheral temperature change of T (°C.) when effecting focusing by means of an AF sensor can be expressed by the following equation:

$$\Delta F(T) = \{(-\Delta l_{LENS} + \Delta f_{LENS}) + l_{AF}\} \times T \quad (1)$$

In this embodiment, however, the entire apparatus is lodged in the chamber 1, so that any change in the environmental temperature is caused by the fluctuation in the accuracy with which the temperature in the chamber is controlled, the fluctuation in the temperature of the heat source (the light source, etc.), the temperature changes in the airflow (the condition for air conditioning) due to the movement of the wafer stage section (8, 9X, and 9Y), etc., T being controlled with an accuracy level of approximately ±0.5° to ±0.1° C.

Further, as shown in FIG. 3, in accordance with this invention, airconditioning spaces (25A and 25B) are specially provided along the lens barrel of the projection optical system 7, and a fluid which is precisely temperature controlled by the temperature controller 21 circulates through the pipes 22 and 23. Accordingly, assuming that the temperature controlling accuracy of the projection optical system 7, effected by the temperature controller 21, is $T_{SC}$(°C.), the displacement $\Delta F_{SC}$ of the focal position when the peripheral temperature has changed by T(°C.) can be expressed by the following equation ($T_{SC}$ is normally approximately ±0.1° C.):

$$\Delta F_{SC} = |(-\Delta l_{LENS} + \Delta f_{LENS}) \times T_{SC}| + |\Delta l_{AF} \times T| \quad (2)$$

The reason for expressing the focal position variation $\Delta F_{SC}$ as a sum of absolute values is that the accuracy in temperature control $T_{SC}$ and the peripheral temperature variation T fluctuate independent of each other, the direction of expansion/contraction of the projection optical system 7 being capable of being reverse to that of the AF sensor in the worst case. Accordingly, it can be seen that, when $|\Delta l_{AF} \times T|$ of equation (2) is large, the wafer W cannot be set within the depth of focus of the projection optical system 7 through the temperature stabilization of the projection optical system 7 alone.

In view of this, this embodiment employs displacement meters 12a and 12b for measuring the relative displacement in the Z-axis direction between the projection optical system 7 and the AF sensor. To bring the wafer W into the optimum image forming plane, the AF sensor is offset by the variation in the output of these displacement meters, i.e., by the relative displacement $\Delta L$ between the projection optical system 7 and the AF sensor. The variation $\Delta L$ ($\mu m$) in the output of the displacement meters 12, however, is to be expressed as follows:

$$\Delta L = \Delta l_{AF} - \Delta l_{LENS} \quad (3)$$

Accordingly, assuming that, when no temperature stabilization of the projection optical system 7 is effected, the AF sensor is offset by the above-mentioned $\Delta L$ on the occasion of focusing using the AF sensor, the actual focal position variation $\Delta F'(T)$ can be expressed, from equation (1), as follows:

$$\Delta F(T) = \{(-\Delta l_{LENS} + \Delta f_{LENS}) + \Delta l_{AF} - \Delta L\} \times T \quad (4)$$
$$= \Delta f_{LENS} \times T$$

When effecting the temperature stabilization of the projection optical system 7, the focal position variation $\Delta F_{SC}'$ can be expressed, from equation (2), as follows:

$$\Delta F_{SC}' = \Delta f_{LENS} \times T_{SC} \quad (5)$$

Comparison of equations (1) and (2) with equations (4) and (5) will make it clear that, in this embodiment, the relative displacement between lens barrel of the projection optical system 7 and the AF sensor has no influence on the focal position displacement. While these equations represent a stationary state where it is only the temperature T or Tsc that varies, the effect obtained is completely the same in a transient state.

Next, the operation of this embodiment will be briefly described with reference to FIG. 2. In this embodiment, the focal position correction for the wafer W is effected by transmitting a command signal from the controller 10 to the motor 19 to drive the Z-stage 8. In this process, the controller 10 receives a signal DSS indicative of the relative displacement $\Delta L$ which is supplied from the displacement meters 12 as well as a signal ESS (environmental information) which is supplied from a measuring instrument 14 for measuring the environmental conditions (the atmospheric pressure, humidity, etc.), and calculates the offsetting amount of the focal position to be corrected. The reason for making the controller 10 receive the signal ESS from the measuring instrument 14 is that any change in the atmospheric pressure, humidity, etc. also causes the focal position to vary. The controller 10 transmits a signal HCS indicative of this offsetting amount to the light receiving element 15B, and causes the plane parallel glass HV provided in the light receiving element 15B to incline in correspondence with the offsetting amount, thereby offsetting the AF sensor. As a result, the relative displacement between the projection optical system 7 and the AF sensor, and the focal position variation (the defocusing amount) attributable to changes in the environmental conditions are reduced to approximately zero. When, afterwards, the wafer W has reached a position below the projection optical system 7, the deviation of the wafer W with respect to a present value (the optimum image forming plane) is measured by the AF sensor (the light receiving element 15B), and the controller 10 receives a signal PSS indicative of this deviation amount. Then, an MDS signal is supplied to the motor 19 until the deviation amount signal PSS is reduced to zero, driving the Z-stage 8 in the vertical direction. Through the above-described operation, the wafer W can be brought into coincidence with the optical image forming plane.

As described above, in this embodiment, the AF sensor is offset, i.e., the plane parallel glass plate HV in the light receiving element 15B is inclined, in order to reduce the focal position variation caused by the relative displacement between the projection optical system 7 and the AF sensor to approximately zero. However, the method of correcting the focal position variation is not restricted to the above. For example, it is also possible to adopt a method in which the signal PSS is offset prior to its reaching the controller 10, or a method in which a field lens is provided between the reticle R and the projection optical system 7, inclining this field lens in correspondence with the above offsetting amount, or a method in which the focal position is corrected by controlling the pressure in the air chambers by means of the pressure controller 17 shown in FIG. 3. In the method using the pressure controller 17, however, it is desirable that at least two air chambers be provided in the projection optical system 7, and that the respective pressures in these air chambers be controlled independently of each other, thereby making it possible to control the projecting magnification and the focal position separately.

While in the embodiment of this invention described above no consideration is given to the focal position displacement due to the absorption of illuminating light by the projection optical system 7, the expansion of the lens barrel of the projection optical system 7 due to the temperature rise as a result of the absorption of illuminating light by the projection optical system is actually included in the displacement $\Delta L$ measured by the displacement meters 12. The focal position variation due to the light absorption is caused by the accumulation of heat in the projection optical system 7. To cope with this, a method has been proposed which is disclosed, for example, in U.S. Pat. No. 4,666,273. In this method, the quantity of illumination light is measured to obtain the accumulated amount of incident energy through calculation, and then, the accumulated energy is converted to a focal position variation, thereby effecting correction. However, this method has the problem that the focal position correction will be performed in a duplicate manner unless the above-described focal position offset correction by the displacement meters 12 is separated from the above-described compensation for the light absorption through measurement of the quantity of light.

Figure 2:
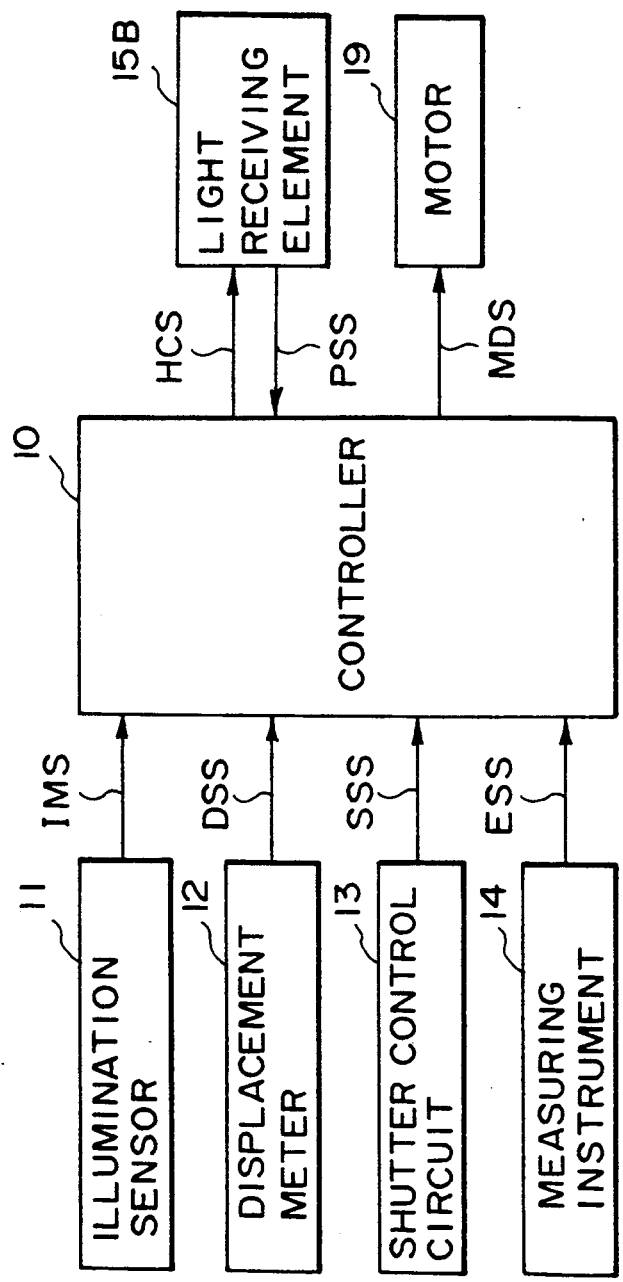
FIG. 2 is a block diagram illustrating the focal position correcting operation in accordance with this invention.

To cope with this problem, the method of compensating for the focal position variation due to the light absorption will be first described briefly with reference to FIGS. 2 and 3. The calculation of the focal position variation due to the light absorption is effected by measuring the incident energy of the illuminating light introduced into the projection optical system 7. Specifically, the wafer stage section is moved so as to bring the illumination sensor 11 to a position below the projection optical system 7 after the replacement of the reticle or the change of the position of a variable blind (not shown) limiting the exposure area on the reticle, and the energy passing through the projection optical system 7 is measured by the illumination sensor 11, transmitting an IMS signal to the controller 10. The controller 10 further receives a signal indicative of whether the illuminating light is incident on the projection optical system 7 or not, i.e., the shutter opening/closing signal SSS generated in the shutter control circuit 13, calculating the energy accumulated in the projection optical system 7 on the basis of these two signals. Then, on the basis of the previously obtained focal position variation characteristic (the relationship between the accumulated energy amount and the focal position variation), a focal position variation due to changes in the exposure condition, which is in accordance with the result of the above calculation, is obtained. Subsequently, the AF sensor is offset in accordance with the focal position variation, and then, the position of the wafer W is servo-controlled using the AF sensor thereby correctly bringing the optimum image forming plane and the wafer surface into coincidence with each other.

To avoid a duplicated correction as mentioned above, an experiment for obtaining the variation characteristic of the above-mentioned focal position variation is performed with the focal position offset correction effected by means of the displacement meters 12 as described above. Obtained through this experiment is the focal position variation characteristic which is due only to the factor exclusive of the relative displacement between the projection optical system 7 and the AF sensor, which is mainly attributable to the expansion of the lens barrel, i.e., to the light absorption. By obtaining the focal position variation corresponding to the accumulated energy in the projection optical system 7 on the basis of the results of the above experiment, the focal position variation due to the expansion of the lens barrel can be eliminated, thereby making it possible to perform the correction of the focal position variation due to the light absorption without performing a duplicated correction as In the above-described embodiment, the focal position correction is effected by measuring the relative displacement between the projection optical system 7 and the AF sensor. Since, however, the focal position in a stepper is determined by the positional relationship between the reticle R and the wafer W, any change in the gap between the reticle R and the projection optical system 7 including the positional deviation in the Z-axis direction of the reticle R also constitutes a factor causing a focal position variation. In view of this, it may be possible to effect, on a line similar to that in the above-described embodiment, offset correction of the focal position by measuring the displacement in the mechanical distance between the projection optical system 7 and the reticle R. This method will be briefly described below.

Generally, the reticle R is attracted by vacuum to a reticle holder (not shown), which is provided on the reticle stage section RS which is capable of making a jogging movement in a plane perpendicular to the optical axis so as to positioning the reticle R. The reticle stage section RS is attached to the apparatus body by means of a column (not shown) which is provided on the column 20 in such a manner as to surround the projection optical system 7. As in the case of the AF sensor described above, the reticle R is displaced in the Z-axis direction as a result, for example, of a metal expansion caused by changes in the peripheral temperature, so that the distance between the reticle R and projection optical system 7 may be changed. Thus, assuming that the displacement of this reticle R is 1r and the magnification of the projection optical system 7 is 1/M, the focal position variation due to the change in the above gap can be expressed as: $1r/M^2$. That is, it is possible to obtain the focal position variation through calculation. Accordingly, the controller 10 receives the value of the displacement 1r, and, by performing the focal position correction through the same operation as in the above-described embodiment on the basis of the focal position variation calculated from this displacement 1r, the focal position variation due to the relative displacement between the reticle R and the projection optical system 7 can be reduced to approximately zero. The displacement 1r may be regarded as the distance between the reticle R and that lens element in the projection optical system 7 which is nearest to the reticle R (the uppermost lens element). However, it is difficult to directly measure the relative distance between the reticle R and the uppermost lens element, so that a differential transformer, a distortion gage, a capacity type displacement sensor, a light wave gage interferometer or the like is provided between the reticle holder or the reticle stage section As and the topmost section of the lens barrel of the projection optical system 7, regarding the measured value thereof as the relative displacement 1r.

Further, the relative displacement between the reticle R and the projection optical system has an effect on the projecting magnification of the projection optical system 7 when the projection optical system 7 is not telecentric on the reticle side, and, it has an effect on the distortion of the projection optical system 7 when the projection optical system is telecentric. Accordingly, it is possible to estimate the variation in the projecting magnification and the distortion of the projection optical system on the basis of the measurement results obtained by the above-described method. The correction of these values may be effected, for example, by causing the reticle R to make a jogging movement in the Z-axis direction, by moving part of the lens elements of the projection optical system 7 in the direction of the optical axis or the inclination, or by providing a sealed space in the projection optical system 7 or in at least one of spaces arranged above and below it and varying the inner pressure, the temperature, etc. of this sealed space. Further, since the inclination of the reticle R also has an effect on the distortion, it is possible to compensate for any distortion on the basis of the inclination of the reticle R by measuring the displacement 1r at a plurality of points.

As described above, this invention aims to eliminate the influence of the relative displacement between the projection optical system 7 and the AF sensor (the light emitting element 15A, the light receiving element 15B, and the fittings 16). Accordingly, instead of utilizing a displacement measuring means as in this invention, it might be possible to adopt a system in which the respective thermal expansion coefficients of the projection optical system 7 and the AF sensor are equalized, or a system in which the projection optical system 7 and the AF sensor 15 are formed integrally. The former system, however, involves a difficulty in selecting appropriate materials, the latter system being difficult to practice in terms of machining and construction. Thus, the focal position correcting mechanism of this invention is superior to such systems.

Thus, in accordance with this invention, it is possible to cancel the variation in the focal position due to the relative displacement between the means for detecting the position of the photosensitive substrate and the projection optical system, thereby making it possible to keep the focal position variation due to the final temperature change at a low level.

What is claimed is:

1. A projection-type optical apparatus, comprising:
    a projection optical system adapted to project an image of an object provided on a first plane upon a substrate on a second plane;
    position detecting means mechanically connected to said projection optical system and adapted to detect the position of said projection optical system relative to said substrate along the optical axis of the projection optical system;
    displacement measuring means for measuring a relative displacement between said position detecting means and said projection optical system along said optical axis; and
    position adjusting means for bringing said substrate into coincidence with an optimum image forming plane of said projection optical system on the basis of the position detected by said position detecting means and the displacement measured by said displacement measuring means.

2. A projection-type optical apparatus, comprising:
    a projection optical system adapted to project an image of an object provided on an first plane on a substrate on a second plane;
    position detecting means mechanically connected to said projection optical system and adapted to detect the position of said projection optical system relative to said substrate along the optical axis of the projection optical system;

displacement measuring means for measuring a relative displacement between said position detecting means and said projection optical system along said optical axis;

offsetting means for correcting the position detected by said position detecting means in accordance with the displacement measured by said displacement measuring means; and position adjusting means for bringing the surface of said substrate into coincidence with an optimum image forming plane of said projection optical system on the basis of the position detected by said position detecting means which has been corrected by said offsetting means.

3. A projection-type optical apparatus as claimed in claim 2, wherein said position detecting means includes a light emitting element which irradiates said substrate with light, and a light receiving element which receives the light emitted from said light emitting element and reflected by said substrate; and wherein said offsetting means includes a plane parallel glass plate which is provided between said light emitting element and said light receiving element and whose inclination is adjustable.

4. A projection-type optical apparatus as claimed in claim 2, further comprising:

energy detecting means for calculating the energy accumulated in said projection optical system as a result of light absorption so as to adjust said offsetting means.

* * * * *